Figure 1A:
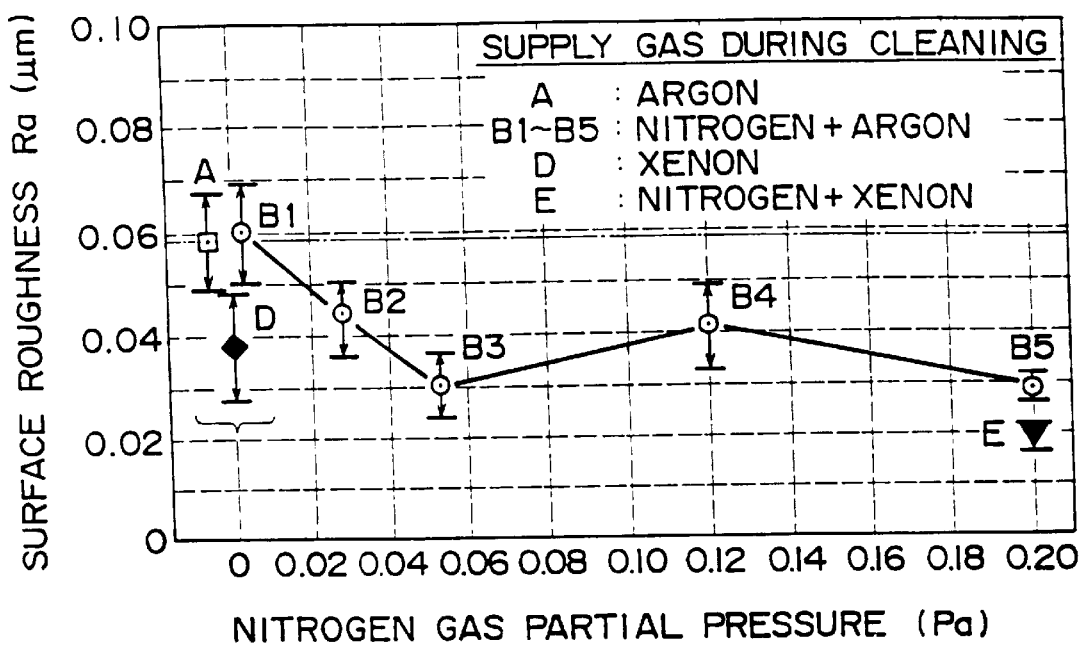

United States Patent
Akari

[11] Patent Number: 5,961,729
[45] Date of Patent: Oct. 5, 1999

[54] VACUUM ARC EVAPORATION METHOD

[75] Inventor: Koichiro Akari, Takasago, Japan

[73] Assignee: Kabushiki Kaisha Kobe Seiko Sho, Kobe, Japan

[21] Appl. No.: 08/769,630

[22] Filed: Dec. 18, 1996

[30] Foreign Application Priority Data

Dec. 18, 1995 [JP] Japan .................................. 7-329190

[51] Int. Cl.[6] ...................................................... B08B 7/00
[52] U.S. Cl. .............................. 134/1.1; 134/1; 427/540; 427/547; 427/585; 427/598
[58] Field of Search .................. 134/1, 1.3, 1.1, 134/1.2; 204/41, 192.33; 427/580, 598, 532, 534, 536, 537, 540, 547, 585

[56] References Cited

U.S. PATENT DOCUMENTS

| | | | |
|---|---|---|---|
| 4,683,149 | 7/1987 | Suzuki et al. ............................ | 427/528 |
| 4,693,760 | 9/1987 | Sioshansi .................................. | 427/524 |
| 4,857,137 | 8/1989 | Tachi et al. ................................. | 216/66 |
| 5,126,030 | 6/1992 | Tamagaki et al. ................. | 204/192.38 |
| 5,182,000 | 1/1993 | Antonelli et al. ..................... | 204/181.1 |
| 5,342,283 | 8/1994 | Good . | |
| 5,346,600 | 9/1994 | Nleh et al. ............................ | 204/192.3 |
| 5,580,429 | 12/1996 | Chan et al. ......................... | 204/192.38 |

*Primary Examiner*—Jill Warden
*Assistant Examiner*—Alexander Markoff
*Attorney, Agent, or Firm*—Oblon, Spivak, McClelland, Maier & Neustadt, P.C.

[57] ABSTRACT

A vacuum arc evaporation method of disposing a vacuum arc evaporation source and a substrate in a vacuum chamber, and introducing ions generated by arc discharge on the surface of the vacuum arc evaporation source to the substrate by means of magnetic fields, thereby forming a film, wherein the substrate is cleaned before forming the film by generating the arc disc while supplying a gas mixture of a nitrogen gas and an argon gas, a xenon gas, or a gas mixture of nitrogen gas and a xenon gas in the vacuum chamber. A film with improved adhesion and surface roughness can be obtained.

9 Claims, 2 Drawing Sheets

VACUUM ARC EVAPORATION METHOD

BACKGROUND OF THE INVENTION

1. Field of the Invention

The present invention concerns a vacuum arc evaporation method which is applied when a wearing resistant film or the like is formed, for example, on the surface of tools or dies.

2. Prior Art Statement

In tools or dies, performance such as cutting property or durability can be increased by coating a wearing resistant hard film, for example, comprising TiN. An example of a vacuum arc evaporation device for use in formation of such films is disclosed in laid-open technical publication No. 93-8299 issued by Hatsumei Kyokai. The constitution of the device is explained with reference to FIG. 2 as an explanatory view for the present invention. The device has a vacuum chamber 1 in which a film forming chamber 3 having a substrate 2 (for example, a tool) disposed therein and an ion generation chamber 5 having a vacuum arc evaporation source 9 comprising a Ti target or the like disposed therein are connected with each other by way of a tubular portion 4.

In this device, the evaporation source 9 is locally evaporated and further converted into plasmas by generating an arc spot on the surface of a vacuum arc evaporation source 9, that is, an arc evaporation surface 9a. A TiN film is formed on the surface of the substrate 2 by introducing positive ions in the plasmas to the substrate 2 and supplying a nitrogen gas into the vacuum chamber 1 for reaction. For introducing the positive ions to the substrate 2, an air-core coil 10 is wound around the outer circumference of the tubular portion 4 for forming magnetic fields from the arc evaporation surface 9a to the substrate 2. Further, a negative bias voltage is applied to the substrate 2.

It should be noted that before forming the film to the surface of the substrate 2 as described above, the substrate 2 is cleaned by ion bombardment. This has been conducted by supplying an argon gas into the vacuum chamber 1 and increasing a negative voltage applied to the substrate 2 higher than that upon film formation. In this case, the argon gas is also ionized by the arc discharge in the ion generation chamber 5, which is introduced to the surface of the substrate 2 and further accelerated by an electric field in the periphery of the substrate applied with the high negative voltage and caused to collide against the substrate 2. This sputters the surface of the substrate 2 and removes contamination or the like on the surface to clean up the substrate. By applying the cleaning as described above, adhesion between the film to be formed subsequently and the substrate 2 is improved.

The arc spot described above moves at a high speed on the arc evaporation surface 9a. From the arc spot, electrons and vapors of materials, as well as molten particles (macro particles) are scattered. If the molten particles are deposited to the substrate 2 during cleaning, the surface roughness of the film layer formed subsequently is deteriorated.

Then, for reducing the deposition of the molten particles on the substrate 2, magnetic fields are formed between the ion generation chamber 5 and the film forming chamber 3 by the air-core coil 10 in the device described above and the ions are introduced to the substrate 2 by the magnetic fields. That is, no induction effects by the magnetic fields exert on the neutral molten particles, thus molten particles reaching and depositing on the substrate 2 are reduced.

Further, the magnetic fields described above are determined such that they have a component in parallel with the surface on the arc evaporation surface 9a, that is, a component is perpendicular to ions or electrons flowing out of the arc spot. This also causes an effect of compulsorily moving the arc spot by electromagnetic inter-repulsing action, and the arc spot moves on the arc evaporation surface 9a at a higher speed. As a result, the staying time of the arc spot at one position is shortened to reduce a molten region at the periphery of the arc spot and the amount of the molten particles generated from the arc evaporation surface 9a is also decreased. As described above, the reduction of the surface roughness caused by the molten particles can be suppressed to some extent by the combined use of magnetic field effects.

However, also in the device as described above, although the adhesion between the film and the substrate 2 is increased by the existent cleaning method described above, the surface roughness is still deteriorated due to the molten particles deposited on the surface of the film, so that it leaves a problem that a film having satisfactory characteristic cannot be formed.

OBJECT OF THE INVENTION

The present invention has been accomplished in view of the foregoing problem and it is an object of the invention to provide a vacuum arc evaporation method capable of obtaining satisfactory intimate adhesion between the film layer and the substrate and capable of further improving the surface roughness of the film.

SUMMARY OF THE INVENTION

For attaining the foregoing object, in accordance with a first aspect of the present invention, there is provided a vacuum arc evaporation method of disposing a vacuum arc evaporation source and a substrate in a vacuum chamber, and introducing ions generated by arc discharge on the surface of the vacuum arc evaporation source to the substrate by means of magnetic fields, thereby forming a film, wherein the substrate is cleaned before forming the film by generating the arc discharge while supplying a gas mixture of a nitrogen gas and an argon gas in the vacuum chamber.

In this case, the substrate is cleaned while desirably a partial pressure of the nitrogen gas at from 0.02 to 0.08 Pa, a partial pressure of the argon gas at from 0.1 to 1.0 Pa and a bias voltage applied to the substrate at from −300 to −2000 V.

When the gas mixture of the nitrogen gas and the argon gas is thus supplied, a surface layer of the vacuum arc evaporation source is nitrided and the melting point is increased to lower the work function. This can reduce the generation of molten particles from the arc evaporation surface, the molten particles deposited on the surface of the substrate are reduced, and the surface roughness of the film formed subsequently is improved. Although the ionized nitrogen gas has less sputtering effect and less cleaning effect, combining it the argon gas with having the same cleaning effect as in the prior art, adhesion between the film and the substrate can also be attained.

In accordance with a second aspect of the present invention, there is provided a vacuum arc evaporation method of disposing a vacuum arc evaporation source and a substrate in a vacuum chamber, and introducing ions generated by arc discharge on the surface of the vacuum arc evaporation source to the substrate by means of magnetic fields, thereby forming a film, wherein the substrate is cleaned before forming the film by generating the arc discharge while supplying a xenon gas.

In this case, the substrate is cleaned while desirably setting a pressure of the xenon gas at from 0.1 to 1.0 Pa and a bias voltage applied to the substrate at −300 to −2000 V.

When the cleaning is thus conducted under the supply of the xenon gas, since the xenon gas has a larger mass number than argon, the cleaning effect to the substrate is greater and, accordingly, if molten particles from the arc evaporation surface are deposited on the surface of the substrate during ion bombardment, a sufficient sputtering effect can be obtained also to them. In addition, the arc spot on the arc evaporation surface tends to move at a higher speed in the xenon gas as compared with the case of supplying the argon gas in the prior art, by which the amount of the molten particles generated is also reduced. As a result, when the ion bombardment is conducted under the supply of the xenon gas, firm adhesion is obtained between the film and the substrate, and a film of improved surface roughness can be formed.

In accordance with a third aspect of the present invention, there is provided a vacuum arc evaporation method of disposing a vacuum arc evaporation source and a substrate in a vacuum chamber, and introducing ions generated by arc discharge on the surface of the vacuum arc evaporation source to the substrate by means of magnetic fields, thereby forming a film, wherein the substrate is cleaned before forming the film by generating the arc discharge while supplying a gas mixture of a nitrogen gas and a xenon gas in the vacuum chamber.

In this case, the substrate is cleaned while desirably setting a pressure of the xenon gas at from 0.1 to 1.0 Pa and a bias voltage applied to the substrate at −300 to −2000 V.

When the cleaning is conducted while introducing the nitrogen gas and the xenon gas into the vacuum chamber, it is possible to form a film of further improved surface roughness by the synergistic effect of both of the gases. Further, since the xenon gas has a greater sputtering effect than the argon gas, a sufficient cleaning effect can be obtained to the substrate even if a greater amount of the nitrogen gas is mixed. Accordingly, since it is possible to further suppress the generation of the molten particles by increasing the amount of the nitrogen gas, it is possible to form a film of further improved surface roughness.

DESCRIPTION OF THE ACCOMPANYING DRAWINGS

Figure 1B:
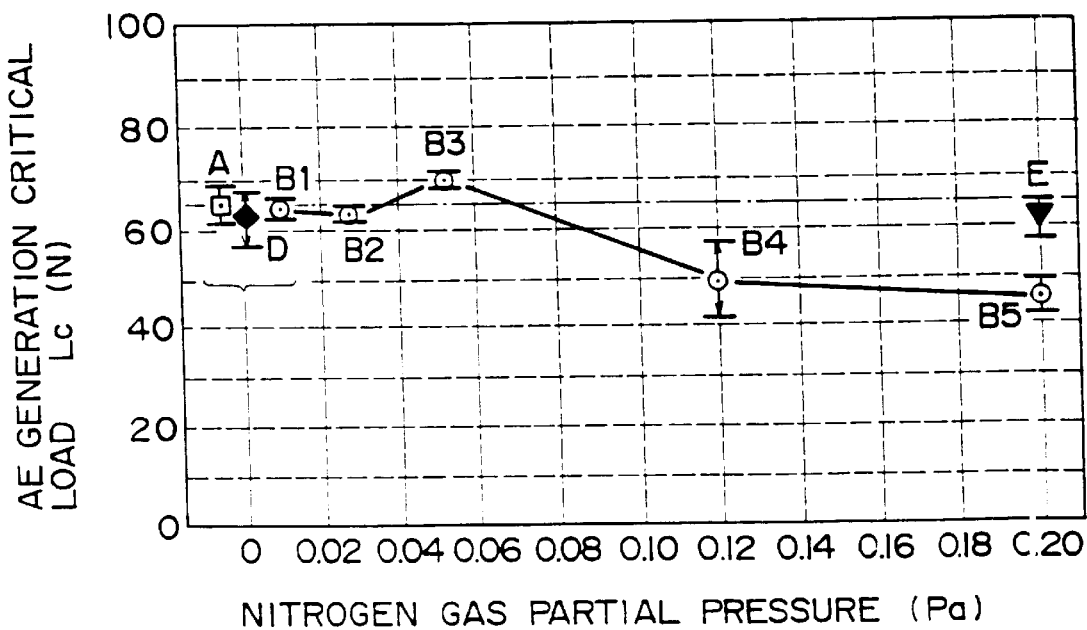
Figure 2:
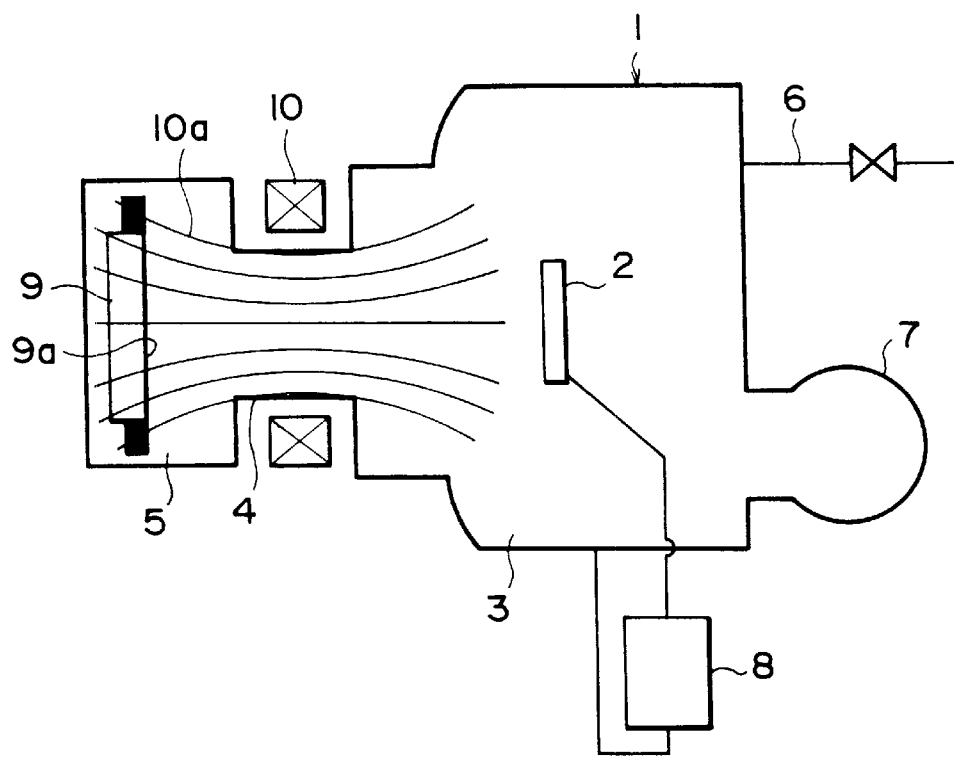
Figure 3:
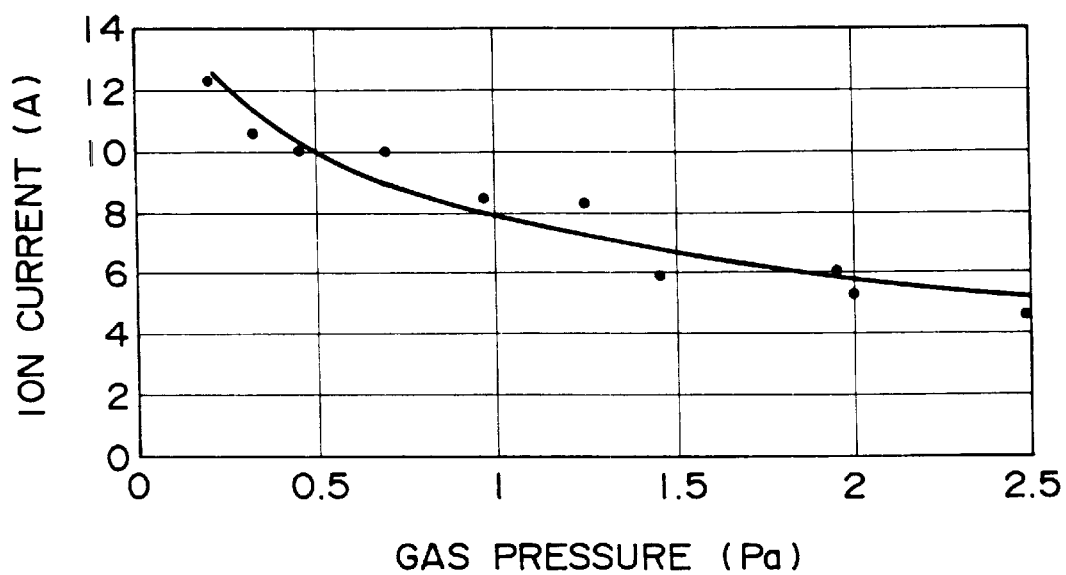

FIGS. 1(a) and 1(b) are graphs showing results of measurements of the properties of the formed film after applying an ion bombardment treatment under each of cleaning gas conditions, in which FIG. 1(a) is a graph for the surface roughness and FIG. 1(b) is a graph showing the adhesion between the film and the substrate;

FIG. 2 is a schematic constitutional view showing an example of a vacuum arc evaporation device to which the method of the present invention is applied; and FIG. 3 is a graph illustrating a relation between a gas pressure and an ion current in the device described above.

PREFERRED EMBODIMENTS OF THE INVENTION

Embodiment 1

The present invention will be explained by way of a preferred embodiment according to the present invention referring to the drawings.

FIG. 2 shows an example of a vacuum arc evaporation device to which the method of the present invention is applied. A vacuum chamber 1 in the figure comprises a film forming chamber 3 in which a substrate 2 is disposed and an ion generation chamber 5 connected with the film forming chamber 3 by way of tubular portion 4. The film forming chamber 3 is connected with a gas supply pipeline 6 and an evacuation pump 7, and a bias voltage generated from a substrate bias power supply 8 is applied to the substrate 2 disposed at the inside of the chamber.

A vacuum arc evaporation source 9 is disposed in the ion generation chamber 5. In the ion generation chamber, an arc generation mechanism (not illustrated) is disposed for generating discharge relative on the vacuum arc evaporation source 9 thereby generating an arc spot to the surface 9a of the evaporation source 9 (hereinafter referred to as an arc evaporation surface). Further, an air-core coil 10 is wound around the outer circumference of the tubular portion 4. By the supply of an electric current to the air-core coil 10, magnetic fields are formed in a region from the ion generation chamber 5 to the film forming chamber 3, and ions in the plasmas generated in the ion generation chamber 5 to be described later are introduced by the magnetic fields from the ion generation chamber 5 to the substrate 2 in the film formation chamber 3.

In the figure, lines of magnetic force 10a are formed by the air-core coil 10 and an arc confining ring (not shown) disposed so as to surround the periphery of the vacuum arc evaporation source 9.

Then, description is to be made for the procedures of forming a film on the surface of the substrate 2 by the device having the constitution described above. Description is to be made for an example of using a Ti target as the vacuum arc evaporation source 9 and forming a TiN film on the surface of the substrate 2 made from high speed steel.

First, the inside of the vacuum chamber 1, in which the vacuum arc evaporation source 9 and the substrate 2 are set, is evacuated by the evacuation pump 7. When a predetermined vacuum pressure is reached, cleaning for increasing adhesion between the film and the substrate 2 (hereinafter referred to as to ion bombardment) is started before forming the film on the substrate 2. For this purpose, a cleaning gas to be described later is supplied through the gas supply pipeline 6 into the vacuum chamber 1 and, at the same time, a predetermined bias voltage is applied from the substrate bias power source 8 to the substrate 2. Then, the arc generation mechanism described above is operated. The conditions in this operation will be described later.

Arc discharge is generated on the arc evaporation surface 9a of the vacuum arc evaporation source 9 by the operation of the arc generation mechanism, and an arc spot on which a discharging current is concentrated is formed on the surface 9a. The vacuum arc evaporation source 9 is locally evaporated at the arc spot in which a large current is concentrated to a minute region, and electrons are emitted therefrom. Evaporated materials and, further, the cleaning gas supplied in the vacuum chamber 1 are ionized by the electrons and form plasmas, and the positive ions in the plasmas are introduced by the magnetic fields formed by the air-core coil 10 from the ion generation chamber 5 to the film formation chamber 3. Then, they are accelerated by an electric field in accordance with the bias voltage applied to the substrate 2 and caused to collide against the surface of the substrate 2. The surface of the substrate 2 is thus sputtered and cleaned by elimination of contaminates.

After applying the cleaning to the substrate 2 for a predetermined period of time, the process successively goes to a step of forming a TiN film. This is started by switching the gas supplied into the vacuum chamber 1 with only the nitrogen gas and switching the bias voltage applied to the substrate 2 to a low voltage at about −50 V. Proceeding from this is the reactive coating of the Ti ions evaporated in the vacuum evaporation source 9 and the nitrogen ions to form a TiN film on the surface of the substrate 2. The thickness of the film is controlled in accordance with the arc current which is set, for example, within a range from 80 to 200 A and the discharging time. When a predetermined film thickness is reached, the arc discharge is stopped to terminate the film formation, and the substrate 2 formed with the TiN film is taken out from the vacuum chamber 1 after the substrate 2 is cooled Next, ion bombardment conditions upon cleaning the surface of the substrate 2 will be explained.

From the viewpoint of improving the surface roughness of the film, a gas mixture of a nitrogen gas and an argon gas is supplied as a cleaning gas in this embodiment.

That is, electrons and vapors of materials, as well as molten particles are scattered from an arc spot on the arc evaporation surface 9a and, if the molten particles are deposited on the substrate 2 during cleaning, the surface roughness of the film is deteriorated. As described above, although the deposition of the molten particles to the substrate 2 can be reduced to some extent by the effect of the magnetic fields of an air-core coil 10, cleaning is conducted in this embodiment by further supplying a gas mixture of nitrogen and argon instead of the argon gas in the prior art as the cleaning gas.

Mixing of the nitrogen gas nitrides the surface layer of the arc evaporation source 9 to result in elevation of the melting point and reduction of the work function to further decrease the generation of the molten particles from the arc evaporation surface 9a. As a result, the surface roughness of the film formed after the cleaning is improved more as compared with the prior art. The nitrogen gas has a less sputtering effect and lesser cleaning effect when it is ionized, but the argon gas provides the same cleaning effect as usual to satisfactorily keep the adhesion between the film and the substrate 2 as in the prior art.

In this case, the gas mixture is adjusted such that the nitrogen gas has a partial pressure (value during arc discharge here and hereinafter) from 0.02 Pa to 0.08 Pa and the argon gas has apart pressure from 0.1 to 1.0 Pa. If the partial pressure of the nitrogen gas is less than 0.02 Pa, no sufficient effect for improving the surface roughness of the film can be obtained. On the other hand, as the partial pressure increases in excess of 0.08 Pa, nitrogen ions with less sputtering effect are predominant in the plasmas to lower the cleaning effect for the substrate 2, so that adhesion between the substrate 2 and the film is gradually lowered Accordingly, the partial pressure of the nitrogen gas is desirably within a range from 0.02 to 0.08 Pa as described above. The argon gas is required by at least about 0.1 Pa for stably generating discharge in the magnetic fields. Further, since there is a correlation between the gas pressure and the ion current as shown in FIG. 3, as the characteristic of the magnetic field-plasma induced type arc evaporation source, it is desirable that the partial pressure of the argon gas as the main component during discharge is less than 1.0 Pa for obtaining large ion current to conduct bombardment efficiently.

It is necessary that the bias voltage applied to the substrate 2 is generally at a high voltage of more than −300 V in order to obtain the sputtering effect described above. On the other hand, the bias voltage is set to lower than the −2000 V in order to prevent generation of abnormal discharge or overheating of the substrate 2. Considering the efficiency of the sputtering effect and the specification of the easily available power source, a more preferred range is from −600 to −1000 V.

A bombarding time is set appropriately so as to obtain a sufficient cleaning effect to the substrate 2 and it is set usually within a range from 1 to 10 min depending on the size and the amount of the substrate 2.

As described above, in this embodiment, generation of the molten particles from the arc evaporation source 9a is suppressed by using the gas mixture of the nitrogen gas and the argon gas as the cleaning gas and conducting the cleaning under the conditions described above, by which more firm adhesion between the substrate 2 and the film can be maintained and, further, a film of improved surface roughness can be formed as compared with the case of the prior art of using only the argon gas.

Embodiment 2

In this embodiment, a xenon gas is used instead of the argon gas of the prior art as the cleaning gas. A TiN film is formed in the substrate 2 under the same ion bombardment conditions such as bias voltage applied to the substrate 2 as those in Example 1.

In this embodiment, the partial pressure of the xenon gas is desirably set within a range from 0.1 to 1.0 Pa by the same reasons as that for setting the partial pressure of the argon gas in the previous embodiment.

Since the xenon gas has a larger mass number than that of the argon gas, it has a large leaning effect to the substrate 2 and, accordingly, by the ion bombardment under the supply of the xenon gas, firm adhesion between the film and the substrate 2 can be obtained, and a sufficient sputtering effect can be obtained for removing the molten particles from the arc evaporation surface 9a during ion bombardment, if they are deposited on the surface of the substrate 2.

Further, since the arc spot on the arc evaporation surface 9a tends to move at a higher speed as compared with the case of supplying only the argon gas of the prior art, so that the amount of the molten particles generated is also reduced. As a result, a firm adhesion between the film and the substrate can be obtained, and a film of improved surface roughness can be formed by ion bombardment under the supply of the xenon gas.

Embodiment 3

In this embodiment, a TiN film is formed on the surface of the substrate 2 in the same manner as in Example 1 while using a gas mixture of a nitrogen gas and a xenon gas as the cleaning gas.

In this case, the partial pressure of the xenon gas is set preferably within a range from 0.1 to 1.0 Pa for the same reason as setting the partial pressure of the argon gas in Embodiment 1 as described above.

When the nitrogen gas and the xenon gas are introduced simultaneously in the vacuum chamber for cleaning, a film of more improved surface roughness can be formed by the synergistic effect of both gases. In the case of supplying the gas mixture of the nitrogen gas and the argon gas as the cleaning gas in embodiment 1, if the partial pressure of the nitrogen gas exceeds 0.08 Pa, the cleaning effect to the substrate 2 is lowered. On the contrary, in this embodiments if the nitrogen gas is mixed such that the partial pressure is about at 0.20 Pa for instance, a sufficient cleaning effect can be obtained to the substrate 2 since the sputtering effect of xenon is large. Accordingly, the effect of reducing the molten particles by the nitrogen gas is exhibited more intensely, and a film with further improved surface roughness can be formed since the amount of nitrogen gas to be mixed can be increased.

EXAMPLE

Next, an explanation is to be made for the result of an actual test when TiN films were formed on the substrate 2 by using the vacuum arc vapor deposition device described above while varying the species and the flow rates of the cleaning gas.

At first, Table 1 shows cleaning gas conditions (species and flow rate of cleaning gas) varied for the ion bombardment conditions in the cleaning step.

In the table, test number A shows a case of supplying only the argon gas as the cleaning gas as in the prior art in which the flow rate is 20 sccm. The pressure in the vacuum chamber 1 during discharge determined depending on the relation with the exhaustion rate by a evacuation system was 0.45 Pa.

Nos. B1–B5 show cases of supplying a gas mixture of an argon gas and a nitrogen gas, in which the argon gas flow rate was kept constant at 20 sccm while the flow rate of the nitrogen gas was varied successively from 5 sccm to 40 sccm. The gas partial pressure in the table are those during arc discharge, which are determined by subtracting the argon gas pressure for No. A from the total gas pressure during discharge. Since nitrogen is consumed in the chamber 1 or at the arc evaporation source 9 during discharge, the nitrogen gas partial pressure is substantially zero during discharge in the case of No. B1 with less gas supply rate.

No. C shows a case of supplying only the nitrogen gas in the cleaning step, No. D shows a case of cleaning under the supply of a xenon gas at 20 sccm and No. E shows a case of cleaning under the supply of a gas mixture of a nitrogen gas (40 sccm) and a xenon gas (20 sccm).

As the substrate 2, high speed steel (SKH-51) was used and a Ti target was set as the vacuum arc evaporation source. Other conditions were made common through each of the tests in which the bias voltage applied to the substrate 2 was kept constant at −800 V, and the ion bombarding time was set to 2 min during ion bombardment. On the other hand, the intensity of the plasma introducing magnetic fields by the air-core coil 10 was set constant at about 200 gauss in the vicinity of the coil center.

After the completion of the ion bombardment under each of the conditions, the TiN films were formed respectively under the following common conditions and, subsequently, the surface roughness of the film, and the adhesion between the film and the substrate were measured for each of the test specimens.

Arc current: 100 A
Nitrogen gas pressure: about 3 Pa
Bias voltage: 50 V

For the surface roughness, Ra values for six points were measured on every test specimens by using a probe type roughness gauge. For the adhesion, AE generation critical loads (Lc value) at three points were measured by an AE type scratch tester on every test specimens.

The results of the measurement are shown together also in Table 1 and FIGS. 1(a) and 1(b) are graphs showing results of measurements corresponding to the change of the partial pressure of the nitrogen gas.

As shown in FIG. 1(a), when the argon gas and the nitrogen gas are used as the cleaning gas (Nos. B1–B5), the surface roughness is improved at a partial pressure of nitrogen during discharge of more than 0.02 Pa (No. B2) compared with that of No. A corresponding to the film formation in the prior art method and the surface roughness tends to the improved along with the increase of the nitrogen gas partial pressure. This is because nitridation on the surface of arc evaporation source proceeds by the introduction of nitrogen to reduce the generation of molten particles.

On the other hand, as shown in FIG. 1(b), the adhesion (Lc value) is lower than that for No. A at a nitrogen gas partial pressure of more than 0.12 Pa (No. B4). That is, as nitrogen is increased excessively, nitrogen ions of less sputtering effect are predominant in the plasmas to gradually decrease the effect of cleaning the substrate. Accordingly, the amount of the nitrogen gas introduced is desirably within a range from 0.02 to 0.08 Pa and, optimally, at about 0.05 Pa of the gas partial pressure.

The specimen of No. C in Table 1 shows a case of applying the ion bombardment under the supply of only the nitrogen gas, which showed extremely weak adhesion between the substrate and the film and, since the film was peeled spontaneously after the formation, the surface roughness and the adhesion could not be measured. Accordingly, it is necessary to supply a gas component contributing to the cleaning effect, namely, argon gas in this case.

On the other hand, the specimen of No. D is a case of supplying the xenon gas as the cleaning gas is improved with the surface roughness while maintaining equivalent adhesion as compared with No. A. Similar properties can also be obtained in a case of varying the xenon gas pressure within a range from 0.1 to 1.0 Pa.

The specimen of No. E in a case of applying ion bombardment under the supply of the gas mixture of the nitrogen gas and the xenon gas has substantially equal adhesion with that of No. A and the surface roughness of the film is greatly improved. In addition, since xenon has a larger sputtering effect than argon and provides a sufficient cleaning effect, no reduction of the adhesion was recognized even when the nitrogen partial pressure was as high as 0.20 Pa.

TABLE 1

| | Ion bombardment conditions | | | Film property | | |
|---|---|---|---|---|---|---|
| | Gas supplied [Flow rate (sccm)/ Pressure (Pa)] | | | Surface roughness average Ra | Adhesion average Lc | |
| Test No. | Argon | Nitrogen | Xenon | value (μm) | value (N) | Evaluation |
| A | 20/0.45 | — | — | 0.058 | 65 | — |
| B1 | 20/0.45 | 5/0 | — | 0.060 | 64 | Δ |
| B2 | 20/0.45 | 10/0.027 | — | 0.044 | 63 | ○ |
| B3 | 20/0.45 | 20/0.053 | — | 0.030 | 70 | ○ |
| B4 | 20/0.45 | 30/0.120 | — | 0.041 | 49 | X |
| B5 | 20/0.45 | 40/0.200 | — | 0.030 | 46 | X |
| C | — | 40/0.200 | — | not measurable | not measurable | X |
| D | — | — | 20/0.62 | 0.038 | 63 | ○ |
| E | — | 40/0.200 | 20/0.62 | 0.020 | 62 | ○ |

As described above, in the vacuum arc evaporation method according to the present invention, cleaning is applied before forming the film by supplying the gas mixture of the nitrogen gas and the argon gas, the xenon gas or the gas mixture of the nitrogen gas and the xenon gas into the vacuum chamber.

When the gas mixture of the nitrogen gas and the argon gas is supplied, the substrate is cleaned by the argon gas and, in addition, the surface layer of the vacuum arc evaporation source is nitrided by the nitrogen gas, so that generation of the molten particles is reduced. As a result, it is possible to form a film having good adhesion with the substrate and with improved surface roughness.

When the cleaning is applied under the supply of the xenon gas, since the cleaning effect of the xenon gas is greater than that of the argon gas, and the arc spot on the arc evaporation surface tends to move at a higher speed thereby reducing the amount of the molten particles, it is possible also in this case to form a film having a firm adhesion with the substrate and with excellent surface roughness.

When the cleaning is applied under the supply of the gas mixture of the nitrogen gas and the xenon gas, since a sufficient cleaning effect can be obtained even if the amount of the nitrogen gas mixed is increased, it is possible to form a film with further improved adhesion and surface roughness by the synergistic effect of the nitrogen gas and the xenon gas.

What is claimed is:

1. A vacuum arc evaporation method for forming a film on a substrate, comprising:

placing a vacuum arc evaporation source and a substrate in a vacuum chamber;

introducing ions generated by an arc discharge on the surface of the vacuum arc evaporation source to the substrate by means of magnetic fields, thereby forming a film;

cleaning the substrate before forming the film by generating the arc discharge while supplying a gas mixture of a nitrogen gas and an argon gas in the vacuum chamber; and nitriding the evaporation source with the arc discharge in the presence of said nitrogen gas, thereby reducing an emission of molten particles onto the substrate.

2. A vacuum arc evaporation method as defined in claim 1, wherein:

a partial pressure of the nitrogen gas ranges from 0.02 to 0.08 Pa, a partial pressure of the argon gas ranges from 0.1 to 1.0 Pa, and a bias voltage applied to the substrate ranges from −300 to −2000 V.

3. A vacuum arc evaporation method for forming a film on a substrate, comprising:

placing a vacuum arc evaporation source and a substrate in a vacuum chamber;

introducing ions generated by an arc discharge on the surface of the vacuum arc evaporation source to the substrate by means of magnetic fields, thereby forming a film;

cleaning the substrate before forming the film by generating the arc discharge while supplying a xenon gas in the vacuum chamber; and moving the arc spot exposed to the xenon gas thereby reducing the emission of molten particles onto the substrate.

4. A vacuum arc evaporation method as defined in claim 3, wherein;

a partial pressure of the xenon gas ranges from 0.1 to 1.0 Pa, and a bias voltage applied to the substrate ranges from −300 to −200 V.

5. A vacuum arc evaporation method for forming a film on a substrate, comprising:

placing a vacuum arc evaporation source and a substrate in a vacuum chamber;

introducing ions generated by an arc discharge on the surface of the vacuum arc evaporation source to the substrate by means of magnetic fields, thereby forming a film;

cleaning the substrate before forming the film by generating the arc discharge while supplying a gas mixture of a nitrogen gas and a xenon gas in the vacuum chamber; and nitriding the evaporation source with the arc discharge in the presence of said nitrogen gas, thereby reducing an emission of molten particles onto the substrate.

6. A vacuum arc evaporation method as defined in claim 5, wherein:

a partial pressure of the xenon gas ranges from 0.1 to 1.0 Pa, and a bias voltage applied to the substrate ranges from −300 to −200 V.

7. A vacuum arc evaporation method as recited in claim 3, wherein moving the arc spot is performed by exposing said arc spot to said magnetic fields.

8. A vacuum arc evaporation method as recited in claim 5, further comprising moving the arc spot exposed to the xenon gas, thereby reducing the emission of molten particles onto the substrate.

9. A vacuum arc evaporation method as recited in claim 8, wherein moving the arc spot is performed by exposing said arc spot to said magnetic fields.

* * * * *